(12) United States Patent
Nelle et al.

(10) Patent No.: US 6,894,367 B2
(45) Date of Patent: May 17, 2005

(54) VERTICAL BIPOLAR TRANSISTOR

(75) Inventors: Peter Nelle, München (DE); Matthias Stecher, München (DE)

(73) Assignee: Infineon Technologies AG, Munich (DE)

( * ) Notice: Subject to any disclaimer, the term of this patent is extended or adjusted under 35 U.S.C. 154(b) by 72 days.

(21) Appl. No.: 10/367,005

(22) Filed: Feb. 14, 2003

(65) Prior Publication Data

US 2003/0155631 A1 Aug. 21, 2003

(30) Foreign Application Priority Data

Feb. 14, 2002 (DE) .......................................... 102 06 133

(51) Int. Cl.⁷ ............................................. H01L 27/082
(52) U.S. Cl. ........................ 257/577; 257/273; 257/583; 257/590; 257/592
(58) Field of Search ............................... 257/273, 565, 257/577, 583, 590, 493, 592

(56) References Cited

U.S. PATENT DOCUMENTS

| | | | | |
|---|---|---|---|---|
| 3,920,493 A | * | 11/1975 | Kravitz | 438/350 |
| 4,000,506 A | * | 12/1976 | Hirai et al. | 257/591 |
| 4,007,474 A | * | 2/1977 | Yagi et al. | 257/591 |
| 4,143,392 A | * | 3/1979 | Mylroie | 257/273 |
| 4,151,540 A | * | 4/1979 | Sander et al. | 257/592 |
| 4,178,190 A | * | 12/1979 | Polinsky | 438/340 |
| 4,337,474 A | | 6/1982 | Yukimoto | 257/493 |
| 4,739,386 A | * | 4/1988 | Tanizawa | 327/377 |
| 5,274,267 A | * | 12/1993 | Moksvold | 257/592 |
| 5,602,417 A | * | 2/1997 | Villa | 257/593 |
| 6,114,746 A | * | 9/2000 | Leonardi et al. | 257/592 |
| 6,281,565 B1 | * | 8/2001 | Yoshitake | 257/590 |

FOREIGN PATENT DOCUMENTS

| | | |
|---|---|---|
| JP | 56008873 A | 1/1981 |
| JP | 58048461 A | 3/1983 |
| JP | 60160164 A | 8/1985 |
| JP | 60160165 A | 8/1985 |

* cited by examiner

*Primary Examiner*—George C. Eckert
(74) *Attorney, Agent, or Firm*—Laurence A. Greenberg; Werner H. Stemer; Gregory L. Mayback

(57) ABSTRACT

A vertical bipolar transistor has a J-FET incorporated in an epitaxial layer. The pinch-off voltage of the J-FET is less than the collector-emitter breakdown voltage of a bipolar transistor without the J-FET. This results in a considerable increase in the collector-emitter breakdown voltage up to 30 V or more being possible without having to except limitations with regard to dielectric strength and on resistivity

13 Claims, 2 Drawing Sheets

VERTICAL BIPOLAR TRANSISTOR

BACKGROUND OF THE INVENTION

Field of the Invention

The present invention relates to a vertical bipolar transistor that has a highly doped buried layer of a first conductivity type. A base zone of a second conductivity type, opposite to the first conductivity type, is provided in a semiconductor layer—adjoining the buried layer—of the first conductivity type at a distance from the buried layer. An emitter zone of the first conductivity type is provided in the base zone.

SUMMARY OF THE INVENTION

It is accordingly an object of the invention to provide a vertical bipolar transistor that overcomes the above-mentioned disadvantages of the prior art devices of this general type, in which considerable increases in the collector-emitter breakdown voltage up to 30 V or more is possible without having to except limitations with regard to dielectric strength and on resistivity.

With the foregoing and other objects in view there is provided, in accordance with the invention, a vertical bipolar transistor. The transistor contains a semiconductor layer, a doped buried layer of a first conductivity type disposed in the semiconductor layer, and a base zone of a second conductivity type, being opposite to the first conductivity type, disposed in the semiconductor layer at a distance from the buried layer. An emitter zone of the first conductivity type is disposed in the base zone. At least one region formed of the second conductivity type is disposed in the semiconductor layer in a region approximately below the emitter zone. The region forms a J-FET having a pinch-off voltage less than a collector-emitter breakdown voltage of the vertical bipolar transistor.

In the case of the vertical bipolar transistor of the type mentioned in the introduction, the object is achieved according to the invention by virtue of the fact that the region of the second conductivity type is provided in the semiconductor layer in the region essentially below the emitter zone, and forms a junction field-effect transistor (J-FET), whose pinch-off voltage is less than the collector-emitter breakdown voltage of the bipolar transistor.

The vertical bipolar transistor according to the invention is thus distinguished by a region of the second conductivity type which preferably projects, proceeding from the base zone, into the epitaxial semiconductor layer in the region essentially below the emitter zone. The region may contain two zones that are spaced apart from one another and are essentially provided laterally below the emitter zone. If the emitter zone is of a strip-type configuration, then the two zones are located on both sides below the "emitter strip" and extend, proceeding from the base zone, deeply into the epitaxial semiconductor layer. In this way, the two zones form a J-FET with the buried layer as the drain and the two zones as the gate.

If, in the case of the vertical bipolar transistor constructed in this manner, the emitter-collector voltage is driven up ("ramped up"), then the J-FET pinches off before the critical collector-emitter breakdown voltage Uce0 of the original bipolar transistor without the region or the two zones is reached. This is the case because the pinch-off voltage of the J-FET is less than the collector-emitter breakdown voltage Uce0 of the bipolar transistor.

Simulations and investigations on test structures have shown that the invention makes it possible to achieve an increase in the collector-emitter breakdown voltage from about 12 V (without the region or the two zones) to about 30 V (with the region or the two zones). The region or the two zones are preferably doped so lightly that they ensure a correspondingly high value of the collector-emitter breakdown voltage of the aforementioned 30 V or more. This is the case if the region or the two zones have a doping concentration that is approximately a factor of 10 lower than the doping concentration of the base zone. A suitable value for the doping concentration in the region or the two zones is of the order of magnitude of about $5\times10^{16}$ impurity atoms $cm^{-3}$.

The region or the two zones can be introduced by implantation. It goes without saying, however, that other doping methods are also possible, such as diffusion, for example.

The lateral extent and form of the region is inherently arbitrary. All that is important is that the region forms a J-FET. It is preferably present, however, in the shape of the two zones that—as mentioned—are provided in the region below the emitter zone laterally with respect thereto, proceeding from the base zone, and extent deeply into the epitaxial semiconductor layer. Especially the lateral extent and the configuration of the region or of the two zones may be arbitrary. All that is of importance is that the epitaxial semiconductor layer is depleted of free charge carriers in the region below the emitter zone, that is to say essentially between the two zones that preferably form the region, that is to say the J-FET pinches off before the collector-emitter breakdown voltage of the bipolar transistor without the region is reached, and that the region is doped so lightly that it ensures a correspondingly high collector-emitter breakdown voltage. The pinch-off governed by the J-FET ultimately prevents the origination of a critical field, leading to breakdown, between collector and emitter.

The region or the two zones may project into the epitaxial layer by about 0.25 to 2 $\mu$m, proceeding from the base zone. In this case, the two zones are spaced apart from one another by about 0.5 to 5 $\mu$m. These values only represent examples, however. It goes without saying that other values are also possible for the region or the two zones.

The base zone may have a penetration depth of about 0.25 to 2 $\mu$m, and other values can be chosen here, too.

The first conductivity type is preferably an n conductivity type, so that the vertical bipolar transistor is an NPN bipolar transistor. Instead of a vertical NPN bipolar transistor, however, a PNP bipolar transistor can also be configured according to the invention. In this case, the first conductivity type is a p conductivity type.

The semiconductor body and the epitaxial layer are preferably composed of silicon. Instead of silicon, however, other semiconductor materials such as, for example, SiC, AIIIBV, etc. may also be chosen.

An essential advantage of the invention is that with its aid, for example for a given BCD technology, vertical bipolar transistors, especially NPN transistors, can be realized with a significantly higher collector-emitter breakdown voltage Uce0. Disadvantages of lateral high-voltage transistors such as, in particular, a quasi-saturation due to a high collector bulk resistance are avoided in a simple manner. All this is achieved ultimately by a vertical bipolar transistor being interconnected with a vertical J-FET within one component. This component, that is to say the vertical bipolar transistor according to the invention, is preferably located in an insulation well.

It is possible, in order to improve the edge termination of the component, for the base zone to be configured as "soft" at its edge, that is to say to be doped more lightly.

In the case of a strip-type configuration of the vertical bipolar transistor, the region or the two zones, at the end of the "emitter strip", may project beyond the latter by about 0.25 to 4 μm.

Other features which are considered as characteristic for the invention are set forth in the appended claims.

Although the invention is illustrated and described herein as embodied in a vertical bipolar transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
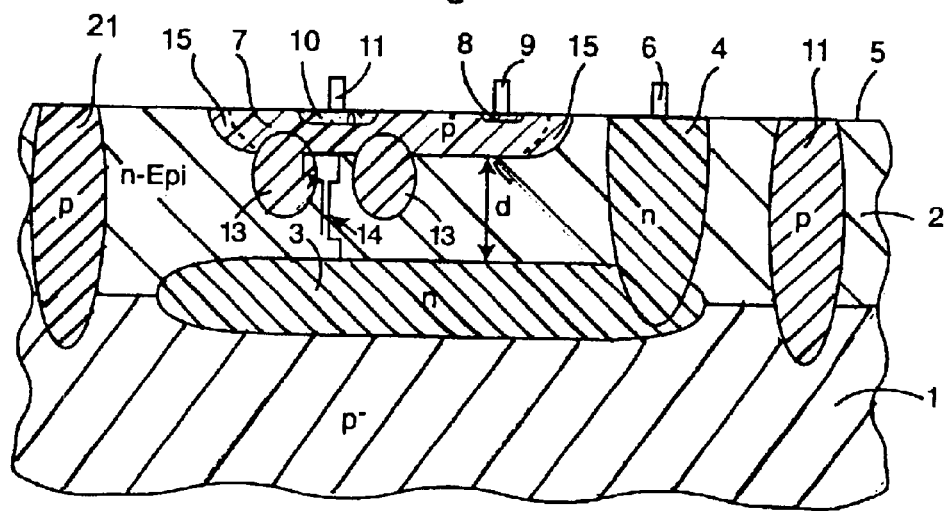
FIG. 1 is a diagrammatic, sectional view of an exemplary embodiment of a vertical bipolar transistor according to the invention.

In the figures, mutually corresponding structural parts are provided with the same reference symbols. Referring now to the figures of the drawing in detail and first, particularly, to FIG. 3 thereof, there is shown the construction of a conventional vertical NPN bipolar transistor in BCD technology (BCD=Bipolar–CMOS–DMOS). The NPN bipolar transistor has, on a p$^-$-doped semiconductor substrate 1 made of silicon, for example, an n-doped epitaxial layer 2 made likewise of silicon, for example. Situated in a region between the semiconductor substrate 1 and the epitaxial layer 2 is an n- or n$^+$-doped buried layer 3 that acts as a collector contact and is at any rate doped more highly than the epitaxial layer 2. The buried layer 3 is connected via an n-doped terminal region 4 to a collector electrode 6 provided on a surface 5 of the epitaxial layer 2. The doping concentration of the terminal region 4 is expediently of the same order of magnitude as the doping concentration of the buried layer 3.

In the region above the buried layer 3, a p-doped base zone 7 is situated at a distance from the latter in the surface 5 of the epitaxial layer 2, which base zone 7 is contact-connected to a base electrode 9 via a p$^+$-doped base terminal region 8. Also provided in the base zone 7 is an n$^+$-doped emitter zone 10, which is provided with an emitter electrode 11.

In addition, a p-doped insulation wall 21 is also shown, which surrounds the NPN transistor formed in this way, containing the emitter zone 10, the base zone 7 and the collector zones 2, 3, 4, and forms, together with the p$^-$-doped semiconductor substrate, an insulation well which electrically insulates the transistor from adjacent components provided in the semiconductor substrate 1 or in the epitaxial layer 2.

The individual dopings containing, for example, boron for p-type conductivity and phosphorus for n-type conductivity can be introduced in a customary manner into the semiconductor substrate 1 or the epitaxial layer 2 by diffusion and/or implantation.

Figure 3:
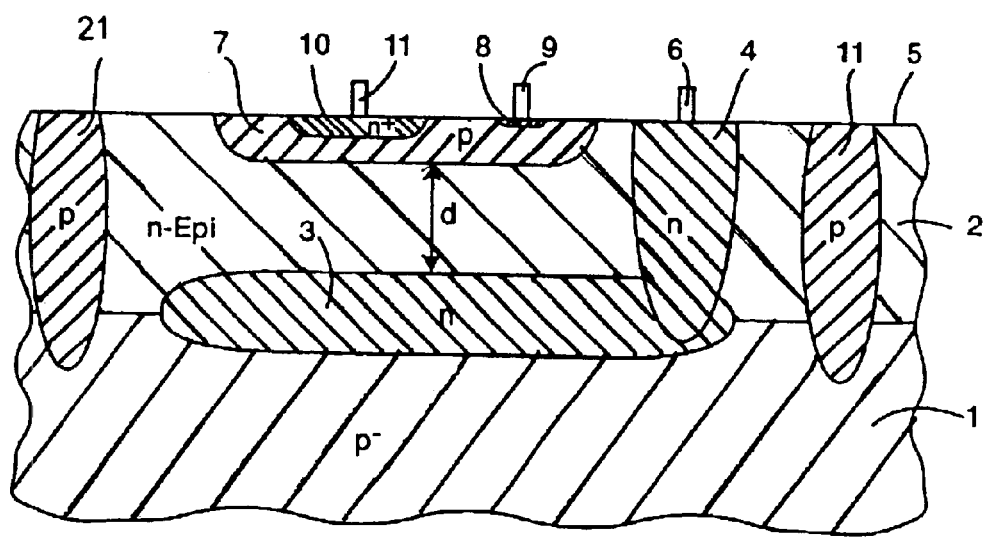
FIG. 3 is a sectional view of a vertical bipolar transistor according to the prior art.

In the case of the NPN bipolar transistor of the type shown in FIG. 3, the collector-emitter breakdown voltage Uce0 is essentially determined by a current gain β (ratio of output current $I_A$ at collector to the input current $I_E$ at emitter) and the collector-base reverse voltage Ucb0:

$$Uce0 = (1/(1+\beta))^{1/n^*} Ucb0 \qquad (1)$$

where n* is an integer number, that is to say n*=2, 3, 4, ... holds true.

It can be seen from equation (1) above that the collector-emitter breakdown voltage Uce0 is closer to the collector-base reverse voltage Ucb0, the smaller the current gain β. In practice, however, it is found that in the case of customary current gains of the order of magnitude of 100 to 200, the collector-emitter breakdown voltage Uce0, with a value of 18 V, for example, is significantly lower than the collector-base reverse voltage Ucb0, with a value of 40 V, for example.

For its part, the collector-base reverse voltage Ucb0 depends on the profile of the doping in the base zone 7, the doping in the n-doped epitaxial layer 2, and on a distance d (see FIG. 3) between the base-collector pn junction and the buried layer 3. This is because a soft, deeply extending profile of the doping in the base zone 7, a low doping in the n-doped epitaxial layer 2 and a large distance d between the base zone 7 and the buried layer 3 thus have the effect that a critical electric field builds up and an avalanche breakdown occurs only in the case of a very high collector-base voltage. In other words, with the corresponding thickness d of the epitaxial layer 2 and suitable doping of the base zone 7 and the epitaxial layer 2, desired high values of 30 V, for example, can be established for the collector-emitter breakdown voltage Uce0.

What is disadvantageous about such a procedure, however, is that the thickness of the epitaxial layer 2 and the doping thereof, particularly in the case of BCD technologies, for example, are prescribed by factors other than the collector-emitter breakdown voltage, namely by the desired high dielectric strength and the sought low on resistivity Ron of DMOS transistors. In other words, it is only possible to achieve a very small increase in the collector-emitter breakdown voltage Uce0 by way of the depth of the base diffusion, that is to say the profile of the base doping, and at the expense of the current gain. Larger increases in the collector-emitter breakdown voltage Uce0 cannot be achieved if the desired high and low values for dielectric strength and on resistivity are on, respectively, are intended to be complied with.

The invention of the instant application overcomes this problem. In addition to the vertical bipolar transistor illustrated in FIG. 3 and has already been explained above, the vertical bipolar transistor according to the invention (FIG. 1) has p-conducting zones 13 as a region of the second conductivity type, which, in the region below the emitter zone 10, proceeding from the base zone 7, extend into the n-doped epitaxial layer 2 and forms a J-FET 14 there.

The zones 13 have a doping concentration of $5 \times 10^{16}$ impurity atoms cm$^{-3}$, for example, if the doping concentration in the base zone 7 is about $5 \times 10^{17}$ impurity atoms cm$^{-3}$. That is to say that the doping concentration of the zones 13 is approximately one order of magnitude lower than the doping concentration of the base zone 7. This condition is not mandatory, however; rather, the difference in doping concentration between the base zone 7 and the zones 13 may also be less than or greater than one order of magnitude. All that is of importance is that the doping concentration in the zones 13 is low enough to ensure a correspondingly high value of the collector-base breakdown voltage Ucb0. The lateral extent and the form of the zones 13 are also arbitrary within wide limits. What is of importance, however, is that the n-doped epitaxial semiconductor layer 2 is depleted in the region below the emitter zone 10, that is to say in the region between the two zones 13, before the collector-emitter breakdown voltage Uce0 of the NPN transistor is reached.

The penetration depth of the base zone 7 into the epitaxial semiconductor layer 2 may be between about 0.25 and 2 µm. The same values may be present for the penetration depth of the zones 13 into the epitaxial semiconductor layer 2. That is to say that the distance between the lower edge of the base zone 7 and the lower edge of the zones 13 may be between 0.25 and 2 µm.

Furthermore, the two zones 13 may be spaced apart by about 0.5 to 5 µm.

It goes without saying that the numerical specifications above can also assume other values. They are merely preferred dimensional specifications.

The edge region of the base zone 7 can be configured "soft", which increases especially the dielectric strength in the edge termination. That is to say that regions 15 are present in which the doping concentration is lower than in the rest or in the center of the base zone 7.

If the emitter-collector voltage is driven up in the case of the vertical bipolar transistor according to the invention, then the J-FET formed by the two zones 13 pinches off before the critical collector-emitter breakdown voltage Uce0 of the original NPN transistor without the zones 13 is reached. In this way, it is possible to achieve an increase in the collector-emitter breakdown voltage Uce0 from about 12 V in the case of transistors without the zones 13 to about 30 V in the case of transistors with the zones 13. Thus, by simple measures, namely the implantation of the regions 13, the invention creates considerable advantages that cannot be obtained with the prior art.

Figure 2:
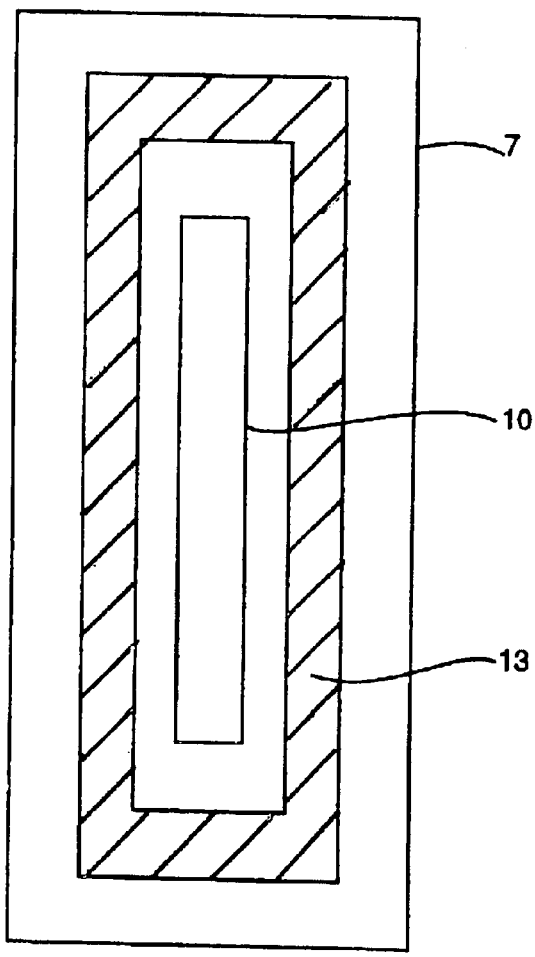
FIG. 2 is a diagrammatic plan view of the vertical bipolar transistor according to the invention.

FIG. 2 shows a diagrammatic plan view of some elements of the vertical bipolar transistor according to the invention, namely the base zone 7, the deeply implanted zones 13 and the emitter zone 10. It can be seen from FIG. 2 that, at the end of the "emitter strip" of the emitter zone 10, the zones 13 project a certain distance beyond the emitter zone 10. This distance may be 0.25 µm to 4 µm, for example.

The exemplary embodiment above shows a vertical NPN transistor. As has already been mentioned, the invention can be applied in the same way to a vertical PNP transistor.

We claim:

1. A vertical bipolar transistor, comprising:
   a semiconductor layer;
   a doped buried layer of a first conductivity type disposed in said semiconductor layer;
   a base zone of a second conductivity type, being opposite to said first conductivity type, disposed in said semiconductor layer at a distance from said buried layer;
   an emitter zone of said first conductivity type disposed in said base zone; and
   at least one region formed of said second conductivity type disposed in said semiconductor layer in a region approximately below said emitter zone and forming a J-FET, said region having a doping concentration being approximately a factor of 10 less than a doping concentration of said base zone, and a pinch-off voltage of said J-FET being less than a collector-emitter breakdown voltage of the vertical bipolar transistor; said region containing two zones disposed laterally below said emitter zone.

2. The vertical bipolar transistor according to claim 1, wherein said two zones are provided on both sides and below said emitter zone, and said emitter zone has a strip-type configuration.

3. The vertical bipolar transistor according to claim 2, wherein said two zones are spaced apart from one another by about 0.5 to 5 µm.

4. The vertical bipolar transistor according to claim 1, wherein said region is connected to said base zone.

5. The vertical bipolar transistor according to claim 4, wherein said region, proceeding from said base zone, projects into said semiconductor layer.

6. The vertical bipolar transistor according to claim 5, wherein said region adjoins said base zone.

7. The vertical bipolar transistor according to claim 1, wherein said region is implanted.

8. The vertical bipolar transistor according claim 1, wherein said doping concentration of said region is about $5 \times 10^{16}$ impurity atoms $cm^{-3}$.

9. The vertical bipolar transistor according to claim 1, wherein said region has a vertical extent of about 0.25 to 2 µm.

10. The vertical bipolar transistor according to claim 1, wherein said base zone has a penetration depth of about 0.25 to 2 µm into said semiconductor layer.

11. The vertical bipolar transistor according to claim 1, wherein said emitter zone and said region each have a strip-type configuration, said region projecting over an end of said emitter zone by 0.25 to 4 µm.

12. The vertical bipolar transistor according to claim 1, wherein said base zone has edge regions defining areas doped more weakly than a rest of the base zone.

13. The vertical bipolar transistor according to claim 1, wherein said first conductivity type is an n conductivity type.

* * * * *